(12) United States Patent
Tanamura et al.

(10) Patent No.: US 7,641,357 B2
(45) Date of Patent: Jan. 5, 2010

(54) LIGHT-EMITTING MODULE AND LIGHT-EMITTING SYSTEM

(75) Inventors: Hiromasa Tanamura, Sakurai (JP); Shinsuke Tachibana, Kashiba (JP); Hitoshi Sannomiya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 510 days.

(21) Appl. No.: 11/658,734

(22) PCT Filed: Jul. 27, 2005

(86) PCT No.: PCT/JP2005/013757

§ 371 (c)(1),
(2), (4) Date: Jan. 29, 2007

(87) PCT Pub. No.: WO2006/011525

PCT Pub. Date: Feb. 2, 2006

(65) Prior Publication Data

US 2009/0168410 A1   Jul. 2, 2009

(30) Foreign Application Priority Data

Jul. 28, 2004   (JP)   ............................. 2004-220847
Jul. 28, 2004   (JP)   ............................. 2004-220852

(51) Int. Cl.
*F21V 9/16* (2006.01)

(52) U.S. Cl. .................. 362/183; 313/498; 320/101; 136/243

(58) Field of Classification Search .............. 362/183, 362/84, 800; 313/498–512; 320/101, 103; 136/243, 244

See application file for complete search history.

(56) References Cited

U.S. PATENT DOCUMENTS 6,356,031 B1 *   3/2002   Thagard et al. .......... 315/169.3

(Continued)

FOREIGN PATENT DOCUMENTS

DE   102 58 712 A1   7/2004

(Continued)

OTHER PUBLICATIONS

International Search Report for PCT/JP2005/013757 mailed Nov. 8, 2005.

(Continued)

*Primary Examiner*—Bao Q Truong
(74) *Attorney, Agent, or Firm*—Nixon & Vanderhye, PC

(57) ABSTRACT

Disclosed is a light-emitting module wherein light entering into a solar cell is not attenuated, thereby preventing power output decrease of the solar cell. In addition, this light-emitting module can be produced by a simple process. Specifically disclosed is a light-emitting module wherein at least (a) a solar cell unit (b) a first adhesive layer, (c) a light-emitting unit composed of a second light-transmitting insulating substrate (transparent PET), a second metal layer (circuit pattern) and a light-emitting element (chip LED), (d) a second adhesive layer and (e) a third light-transmitting insulating substrate are sequentially stacked. The transparent PET having a thickness about 50-500 μm which is provided with the circuit pattern in advance is used for producing the light-emitting unit. A silver paste which can be cured by 30-minute heating at 150° C. is used as a circuit pattern material, and the circuit pattern is formed on the transparent PET by screen printing, and then thermally cured.

11 Claims, 6 Drawing Sheets

U.S. PATENT DOCUMENTS

| | | | |
|---|---|---|---|
| 6,500,295 B1 * | 12/2002 | Kubota | 156/269 |
| 6,501,014 B1 * | 12/2002 | Kubota et al. | 136/256 |
| 6,641,933 B1 * | 11/2003 | Yamazaki et al. | 428/690 |
| 6,965,195 B2 * | 11/2005 | Yamazaki et al. | 313/498 |
| 7,048,400 B2 * | 5/2006 | Murasko et al. | 362/84 |

FOREIGN PATENT DOCUMENTS

| | | |
|---|---|---|
| EP | 1 221 511 A1 | 7/2002 |
| JP | 59-217991 | 12/1984 |
| JP | 60-78477 | 5/1985 |
| JP | 61-049482 | 3/1986 |
| JP | 61-128413 | 6/1986 |
| JP | 63-194370 | 8/1988 |
| JP | 01-143366 | 6/1989 |
| JP | 2-2997 | 1/1990 |
| JP | 05-170028 | 7/1993 |
| JP | 06-224474 | 8/1994 |
| JP | 11-015419 | 1/1999 |
| JP | 2000-031546 | 1/2000 |
| JP | 2001-19231 A | 1/2001 |
| JP | 2001-339092 | 12/2001 |
| JP | 2001-351418 | 12/2001 |
| JP | 2002-008851 | 1/2002 |
| JP | 2003-206512 A | 7/2003 |
| JP | 2003-249666 | 9/2003 |
| JP | 2003-257223 | 9/2003 |
| JP | 2004-198112 | 7/2004 |
| WO | 02/052192 A1 | 7/2002 |
| WO | WO 03/019658 | 3/2003 |
| WO | 03/107722 A2 | 12/2003 |
| WO | 2004/009349 A1 | 1/2004 |

OTHER PUBLICATIONS

Microfilm of the specification and drawings annexed to the request of Japanese Utility Model Application No. 77455/1988(Laid-open No. 2997/1990) Jan. 10, 1990, Fig. 3 (Family: none).

European Search Report mailed Dec. 5, 2008 in corresponding EP application 05767489.9.

* cited by examiner

LIGHT-EMITTING MODULE AND LIGHT-EMITTING SYSTEM

This application is the US national phase of International application PCT/JP2005/013757 filed 27 Jul. 2005, which designated the U.S. and claims priority of JP2004-220847 filed 28 Jul. 2004; JP2004-220852 filed 28 Jul. 2004, the entire contents of which are hereby incorporated by reference.

FIELD OF THE INVENTION

The present invention relates to a light emitting module and a light emitting system, more specifically a light emitting module which is combined with a visible ray transmissible solar battery, and a light emitting system comprising such a light emitting module.

BACKGROUND ART

Hitherto, as such light emitting modules, the following are known: a light emitting device wherein a translucent light emitting section and a solar battery are laminated on a translucent substrate, as described in Patent Document 1; an illumination panel wherein the light receiving face of a solar battery is arranged near a panel-form light emitting body having a light emitting face so as to position the light emitting face and the light receiving face on the same plane, as described in Patent Document 2; and a solar-power-generation-used light emitting module wherein a solar power generation section and a light emitting section which emits light by electromotive force of this solar power generation section are mounted on a single planar substrate, as described in Patent Document 3.

Patent Document 1: Japanese Unexamined Patent Publication No. 59-217991

Patent Document 2: Japanese Unexamined Patent Publication No. 60-78477

Patent Document 3: Japanese Unexamined Patent Publication No. 2001-351418

DISCLOSURE OF THE INVENTION

Problems to be Solved by the Invention

However, in the light emitting device described in Patent Document 1, from its sunlight receiving face side, the translucent light emitting section and the solar battery are successively laminated so that light radiated into the solar battery is attenuated in the translucent light emitting section; thus, the device has drawbacks such that the power of the solar battery unavoidably falls. In the illumination panel described in Patent Document 2, the solar battery, which has the light emitting face, is arranged near the panel-form light emitting body, which has the light emitting face, so as to position the light emitting face and the light receiving face on the same plane; thus, the illumination panel has drawbacks such that the power of the solar battery unavoidably falls because of limitation about area. In the light emitting module described in Patent Document 3, through holes are made in the single planar substrate, wherein the solar power generation section is to be mounted on the front surface and the light emitting section, which emits light by electromotive force of this solar power generation section, is to be mounted on the rear surface; and then printed wiring, a circuit using the electromotive force of the solar battery module, and elements are mounted onto the rear surface. Thus, the module has drawbacks such that limitation is imposed onto the place where the light emitting section is to be mounted.

An object of the present invention is to solve such problems in the prior art, and provide a light emitting module which can prevent a fall in the power of a solar battery without attenuating light radiated into the solar battery, and can easily be produced, and a light emitting system comprising such a light emitting module.

Means for Solving the Problems

According to one aspect of the present invention, provided is a light emitting module comprising at least a) a solar battery section including a first translucent insulating substrate, a transparent electroconductive layer, a photoelectric conversion layer, and a first metal layer, b) a first adhesive layer, c) a light emitting section including a second translucent insulating substrate, a second metal layer, and a light emitting element, d) a second adhesive layer, and e) a protective section of a third translucent substrate which are successively laminated in this order. Alternatively provided is a light emitting module comprising at least a) a solar battery section including a first translucent insulating substrate, a transparent electroconductive layer, a photoelectric conversion layer, and a first metal layer, b) a first adhesive layer, c) a light emitting section including a second translucent insulating substrate, a second metal layer, and a light emitting element, d) a second adhesive layer, and e) a reflective section for reflecting light from the light emitting section which are successively laminated in this order.

According to a different aspect of the invention, provided is a light emitting system comprising: the light emitting module according to the above-mentioned aspect of the invention; a storage battery charged by electric power that is generated in the solar battery section of the light emitting module; and a control section that is electrically connected to this storage battery and the solar battery section and the light emitting section of the light emitting module and that monitors voltage generated in the solar battery section to switch between a charging mode from the solar battery section to the storage battery and a discharging mode from the storage battery to the light emitting section.

EFFECTS OF THE INVENTION

In the light emitting module according to the one aspect of the invention, the solar battery section and the light emitting section are laminated. However, the solar battery section can be arranged on the sunlight receiving face side, and further the solar battery section and the light emitting section are not present on the same plane. Therefore, there disappears a fear that light radiated into the solar battery section is attenuated by the whole or a part of the light emitting section, or a limitation about the occupation area of the solar battery section. Thus, a fall in the power of the solar battery section can be prevented.

In the different aspect of the invention, the control section monitors the voltage generated in the solar battery section, and this generated voltage is compared with a threshold voltage for judging daytime or nighttime, whereby the control section judges the charging mode from the solar battery section of the light emitting module to the storage battery and the discharging mode from the storage battery to the light emitting section of the light emitting module, which is a load. In this way, the light emitting section can be caused to emit light automatically in the nighttime.

EXPLANATION OF REFERENCE NUMBERS

Figure 1:
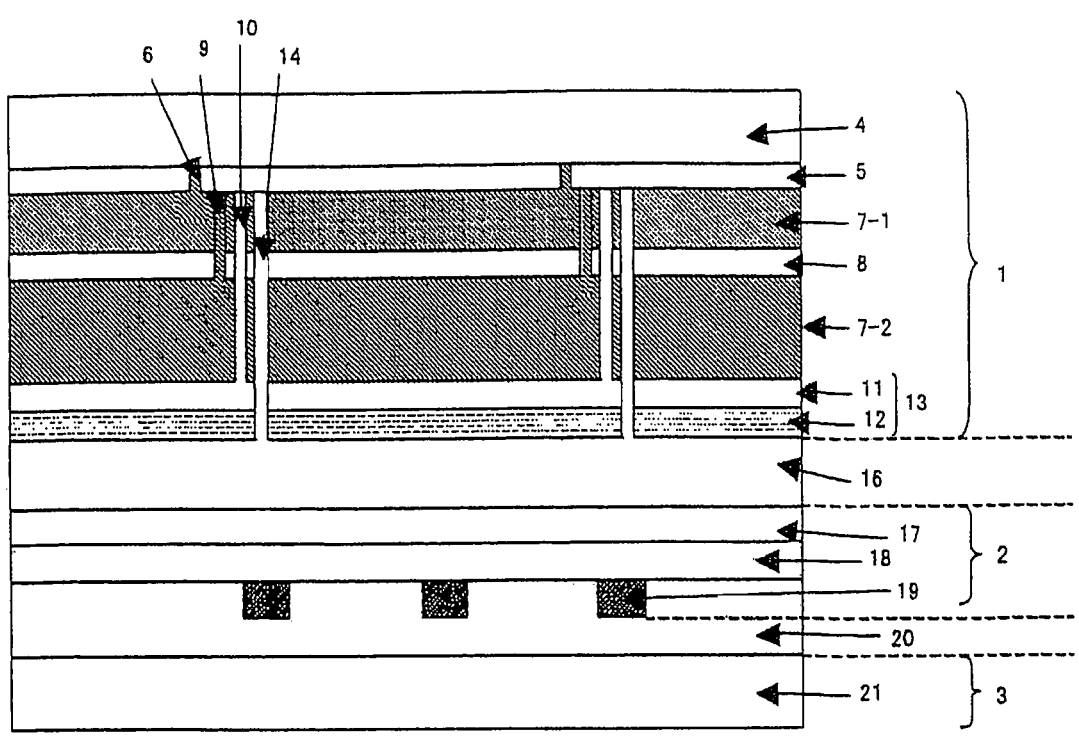
FIG. 1 is a sectional view illustrating a light emitting module according to the invention.

1: solar battery section
2: light emitting section
3: protective section
4: glass substrate (first translucent insulating substrate)
5: transparent electroconductive film (transparent electroconductive layer)
6: separating line
7-1: photoelectric conversion film (photoelectric conversion layer)
7-2: photoelectric conversion film (photoelectric conversion layer)
8: transparent electroconductive film
9: separating line
10: separating line
11: transparent electroconductive film
12: metal electrode film
13: rear side electrode film (first metal layer)
14: separating line
15: translucent opening
16: EVA layer (first adhesive layer)
17: transparent PET (second translucent insulating substrate)
18: circuit pattern (second metal layer)
19: chip LED (light emitting element)
20: EVA layer (second adhesive layer)
21: protective substrate (third substrate)
22: gap
23: land pattern
24: solar-cell-attached light emitting module
25: storage battery
26: control section
27: adhesive layer (third adhesive layer)
28: protective section (fourth light emitting insulating substrate)
29: Ag film

BEST MODE FOR CARRYING OUT THE INVENTION

In the light emitting module according to one aspect of the invention, at least the following are successively laminated: a solar battery section, a first adhesive layer, a light emitting section, a second adhesive layer, and a protective section or a reflective section.

The solar battery section comprises a first translucent insulating substrate, a transparent electroconductive layer, a photoelectric conversion layer and a first metal layer, and is formed, for example, as follows.

A glass substrate is used as the first translucent insulating substrate. On this glass substrate, a transparent electroconductive film as the transparent electroconductive layer is formed at predetermined positions.

First, laser light is used to pattern the transparent electroconductive film. Next, the glass substrate on which the transparent electroconductive film is formed is washed with pure water to form a first photoelectric conversion film as the photoelectric conversion layer. Thereafter, a transparent electroconductive film is formed.

Next, laser light is used to pattern the photoelectric conversion film. Thereafter, a second photoelectric conversion film is formed as the photoelectric conversion layer. Laser light is used to pattern the second photoelectric conversion film. Subsequently, a transparent electroconductive film and a metal electrode film are laminated thereon to form a rear side electrode film as the first metal layer. Next, laser light is used to pattern the rear side electrode film.

This way makes it possible to yield an integrated type thin film solar battery which comprises the glass substrate, the transparent electroconductive film, the first photoelectric conversion film, the transparent electroconductive film, the second photoelectric conversion film, and the rear side electrode film, and is separated into plural power generating areas connected to each other in series on the glass substrate.

The light emitting section comprises a second transparent insulating substrate, a second metal layer, and one or more light emitting elements, and is formed, for example, as follows.

There is used, as the second transparent insulating substrate, transparent PET wherein a circuit pattern as the second metal layer is beforehand formed. As the material of the circuit pattern, silver paste is used. For example, screen printing utilizing a mask is used to make the paste into the circuit pattern onto the transparent PET, and then the paste is thermally cured.

The following are used: light emitting units in each of which chip LEDs, the number of which is predetermined, as the light above-mentioned emitting elements are mounted into the circuit pattern, the number of the units being, for example, four. In each of these light emitting units, a land pattern for mounting the chip LEDs as the light emitting elements is formed, and silver paste is printed and painted onto the land pattern.

Next, each of the chip LEDs is mounted so as to make both polarities of the chip LED electrically conductive through the silver paste painted onto the land pattern. The circuit pattern, on which the chip LEDs are mounted, on the transparent PET is allowed to stand still in a heating furnace, so as to cure the paste thermally.

When the solar battery section and the light emitting section, each formed in the above-mentioned way, are made into a module, a first adhesive layer (for example, an EVA layer) is sandwiched between the solar battery section and the light emitting section. Furthermore, a second adhesive layer (for example, an EVA layer) which has a larger thickness than the height of the chip LEDs arranged in the light emitting section is sandwiched between the light emitting section and a third transparent insulating substrate (for example, a glass substrate) for protecting this light emitting section. The adhesive layers are heated, so as to be melted. Thereafter, the adhesive layers are crosslinked.

In the light emitting module according to the aspect of the invention, a third adhesive layer and a fourth translucent insulating substrate may be further laminated successively on the side of the first translucent insulating substrate opposite to the transparent electroconductive layer side thereof. When the strength of the light emitting module needs to be considered, such a structure makes it possible to make the strength of the light emitting module larger by overlapping the fourth transparent insulating substrate in the state that the third adhesive layer is interposed.

In the light emitting module according to the aspect of the invention, the light emitting section may comprise plural light emitting units. Such a structure makes it possible to make the light emitting area of the light emitting section wider.

The reflective section of the light emitting module according to the aspect of the invention is a section for discharging light emitted in the light emitting section from the solar battery section side without leaking the light from the side opposite to the solar battery section. This reflective section comprises, for example, a protective section composed of a reflective layer and a third substrate.

The light emitting system according to a different aspect of the invention may be a system wherein the light emitting module is fitted into a frame and further a storage battery and a control section are stored in the frame. Such a structure makes it possible to package the solar-cell-attached light emitting system into a single unit.

The light emitting system according to the different aspect of the invention may be a system comprising a terminal box for taking out the power of the solar battery section and a terminal box for applying voltage to the light emitting section wherein these terminal boxes are fixed to a side face of the light emitting module. Such a structure makes it possible that when the solar battery section is of a see-through type, sunlight taken therein is not blocked by the terminal box(es) or wiring which accompanies the box(es).

In the light emitting system according to the different aspect of the invention, the second metal layer in the light emitting section of the light emitting module constitutes a circuit pattern for causing the light emitting element to emit light. This circuit pattern may be made from an electroconductive (metal) paste. Such a structure makes it possible to use an electroconductive paste which can be cured at a temperature of 150° C. or lower and use a PET film, which is advantageous in costs, as the second translucent insulating substrate so as to form a circuit pattern on the above-mentioned substrate.

In the light emitting system according to the different aspect of the invention, the light emitting element may be a chip LED. Such a structure makes it possible to make the thickness of the light emitting module smaller than the case that a lead type LED is used.

In the light emitting system according to the different aspect of the invention, the chip LED may be an LED fitted to the circuit pattern through an electroconductive paste. Such a structure makes it possible to use an electroconductive paste which can be cured at a temperature of 150° C. or lower and use a PET film, which is advantageous in costs, as the second translucent insulating substrate so as to mount a light emitting element on the circuit pattern formed on the above-mentioned substrate.

In the light emitting system according to the different aspect of the invention, all of the adhesive layers in the light emitting module may each be made of a low-temperature crosslinkable EVA film. Such a structure makes it possible to use a plastic substrate having no heat resistance, such as polycarbonate, as any one of the first to fourth translucent insulating substrates and the third substrate. The third substrate may not be any substrate having translucency.

In the light emitting system according to the different aspect of the invention, at least one part of the solar battery section of the light emitting module may be made of a see-through type solar battery. Such a structure makes it possible that at the time when this light emitting system is used in a glass window of a room or at some other time, sunlight is taken into the room from the solar battery section.

With reference to the attached drawings, five embodiments of the invention will be described hereinafter only to show examples thereof.

Embodiment 1

With reference to FIGS. 1 to 3 and FIG. 5, an embodiment (embodiment 1) of the light emitting module according to the one aspect of the invention is described. This light emitting module comprises a solar battery section 1, a light emitting section 2, and a protective section 3.

Figure 2:
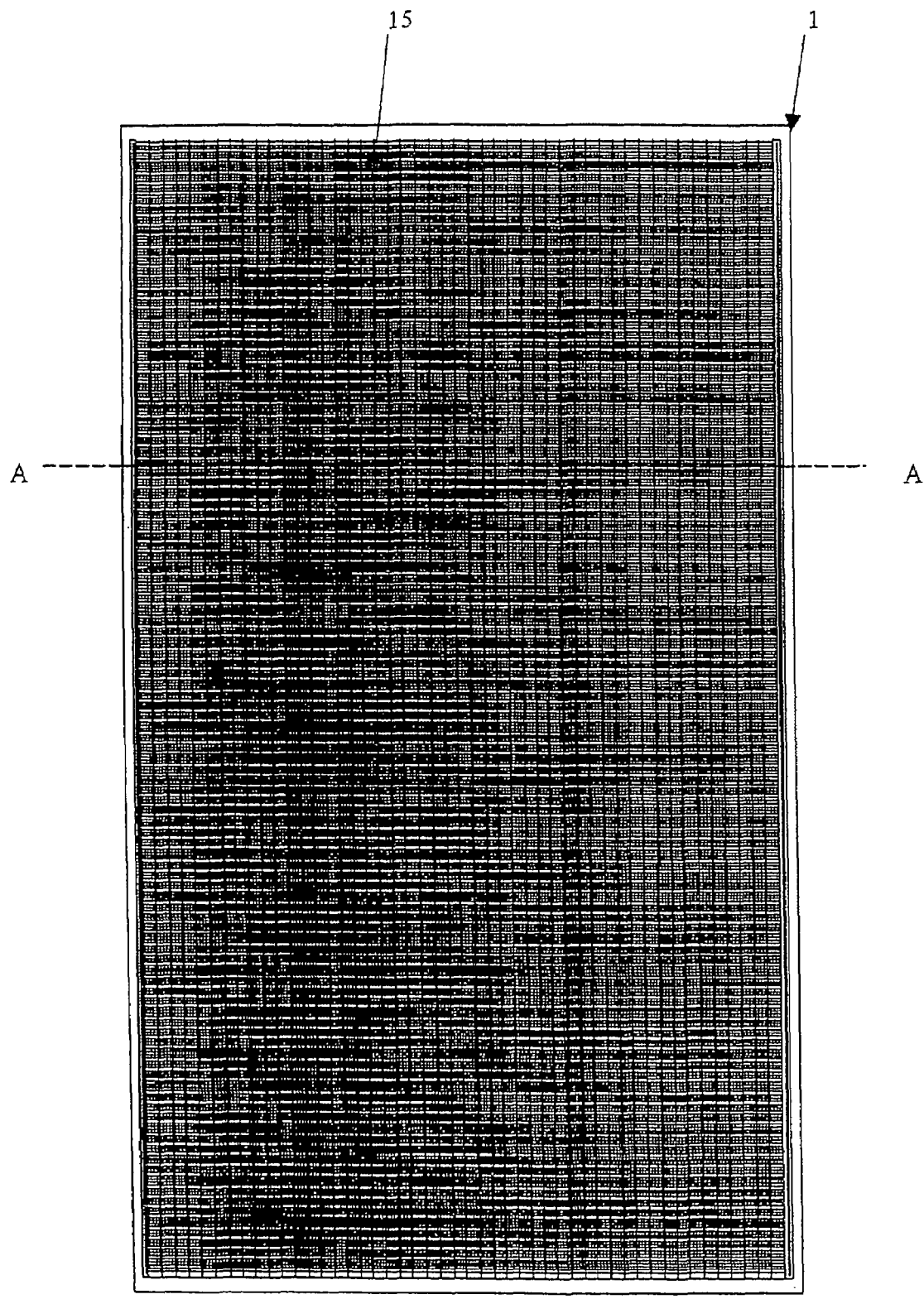
FIG. 2 is a plan view illustrating a solar battery section in the light emitting module in FIG. 1.

In the production of the solar battery section 1 illustrated in FIGS. 1 and 2, there is used a glass substrate 4 as a first translucent insulating substrate on which a transparent electroconductive film 5 is beforehand formed. About this glass substrate 4, the transparent electroconductive film 5 as a transparent electroconductive layer is formed on a single side surface of the glass substrate 4 and end faces of the whole circumference thereof.

Next, laser light is used to pattern the transparent electroconductive film 5. At this time, for example, YAG fundamental wave laser light is used, which is sufficiently absorbed into the transparent electroconductive film 5. When the laser light is radiated thereinto from the side of the glass substrate 4, the transparent electroconductive film 5 is separated into the form of stripes, so that separating lines 6 are formed in the transparent electroconductive film 5.

Next, the glass substrate 4 on which the transparent electroconductive film 5 is formed is washed with pure water, and then a photoelectric conversion film 7-1 is formed as a photoelectric conversion layer. The photoelectric conversion film 7-1 is composed of an a-Si:Hp layer, an a-Si:Hi layer, and an a-Si:Hn layer. The total thickness thereof is from 100 to 300 nm.

Next, a transparent electroconductive film 8 is formed. For the transparent electroconductive film 8, for example, ZnO or ITO is used, which is good in contact property with the a-Si:Hn layer. The total thickness of the transparent electroconductive film 8 is from 5 to 100 nm.

Next, laser light is used to pattern the photoelectric conversion film 7-1. At this time, for example, a YAG SHG laser is used, which has wavelength selectivity, in order to avoid damage of the transparent electroconductive film 5 based on the laser light. When the laser light is radiated thereinto from the side of the glass substrate 4, the photoelectric conversion film 7-1 is separated into the form of stripes and simultaneously the transparent electroconductive film 8 is also removed. As a result, separating lines 9 are formed in the photoelectric conversion film 7-1. The separating lines 9 are each formed at a position about 1 to 50 im apart from each of the separating lines 6 in the transparent electroconductive 8, so as to have a width of about 50 to 200 im and overlap with the latter separating line by a width of about 50 im.

Next, a photoelectric conversion film 7-2 is formed as a photoelectric conversion layer. The photoelectric conversion film 7-2 is composed of a ic-Si:Hp layer, a ic-Si:Hi layer, and a ic-Si:Hn layer. The total thickness is from 1000 to 3000 nm.

Next, laser light is used to pattern the photoelectric conversion film 7-2. At this time, for example, a YAG SHG laser is used, which has wavelength selectivity, in order to avoid damage of the transparent electroconductive film 5 based on the laser light. When the laser light is radiated thereinto from the side of the glass substrate 4, the photoelectric conversion film 7-2 is separated into the form of stripes and simultaneously the photoelectric conversion film 7-1 and the transparent electroconductive film 8 are also removed. As a result, separating lines 10 are formed in the photoelectric conversion film 7-2. The separating lines 10 are each formed at a position about 1 to 50 im apart from each of the separating lines 9, so as to have a width of about 50 to 200 im and overlap with the latter separating line by a width of about 50 im.

Subsequently, a transparent electroconductive film 11 and a metal electrode film 12 are laminated, thereby forming a rear side electrode film 13 as a first metal layer. For the transparent electroconductive film 11, for example, ZnO or ITO is used, which has a small resistivity and a high translucency. For the metal electrode film 12, for example, Al or Ag is used, which has a high reflectivity. The film thickness of the transparent electrode film 11 is from about 50 to 200 nm, and the film thickness of the metal electrode film 12 is from about 500 nm to 1 im. However, the transparent electrode film 11 may be left out.

Next, laser light is used to pattern the rear side electrode film 13. At this time, for example, a YAG SHG laser is used, which has wavelength selectivity, in order to avoid damage of the transparent electroconductive film 5 based on the laser light and remove the photoelectric conversion film 7-1, the transparent electroconductive film 8 and the photoelectric conversion film 7-2 simultaneously. When the laser light is radiated thereinto from the side of the glass substrate 4, the rear side electrode film 13 is separated into the form of stripes and simultaneously the photoelectric conversion film 7-1, the transparent electroconductive film 8 and the photoelectric conversion film 7-2 are also removed. As a result, separating lines 14 are formed in the rear side electrode film 13. The separating lines 14 are each formed at a position about 1 to 150 im apart from each of the separating lines 10 in the photoelectric conversion film 7-2, so as to have a width of about 50 to 200 im and overlap with the latter separating line by a width of about 50 im.

This way makes it possible to yield an integrated type thin film solar battery comprising the glass substrate 4, the transparent electroconductive film 5, the photoelectric conversion film 7-1, which is composed of the amorphous silicon semiconductors, the transparent electroconductive film 8, the photoelectric conversion film 7-2, which is composed of the crystalline silicon semiconductors, and the rear side electrode film 13, this solar battery being separated into plural power generating areas connected to each other in series on the glass substrate 4, wherein the separating lines 14 in the rear side electrode film 13 penetrate through the rear side electrode film 13, the photoelectric conversion film 7-2, the transparent electroconductive film 8 and the photoelectric conversion film 7-1 so as to pattern the solar battery into solar cells having the same shape.

Next, in each of the power generating areas, patterning for making translucent openings 15 is performed. At this time, for example, a YAG SHG laser is used, which has wavelength selectivity, in order to avoid damage of the transparent electroconductive film 4 based on the laser light and remove the photoelectric conversion film 7-1, the transparent electroconductive film 8 and the photoelectric conversion film 7-2 simultaneously. When the laser light is radiated thereinto from the side of the glass substrate 4, the power electric area is worked to make the translucent openings 15. The translucent openings 15 are made perpendicularly to the separating lines 14 in the rear side electrode film 13.

In this example, the translucent openings 15 each having a width of 0.08 mm, the total number of which is 704, are made perpendicularly to the separating lines 14 in the rear side electrode film 13 at a pitch of about 1.27 mm in the power generating areas separated into the stripes having a width of 11.09 mm.

Accordingly, in the solar cells, the number of which is 48, the patterning for making the 704 translucent openings 15 is performed, thereby making it possible to give a numerical aperture of 10% so as to form a solar battery having a substrate size of 560 mm×930 mm and a power output of about 50 watts [W].

In this example, the photoelectric conversion layers have a tandem structure of the a-Si:H and ic-Si:H. However, the layers may have a single structure, tandem structure or triple structure of a-Si:H, a single structure, tandem structure or triple structure of ic-Si:H, or a tandem or triple structure where these are combined. In this example, the see-through type solar battery has been described as one example of the solar battery. However, the solar battery may be any solar battery that can gather light, such as a light-gathering type solar battery.

Figure 3:
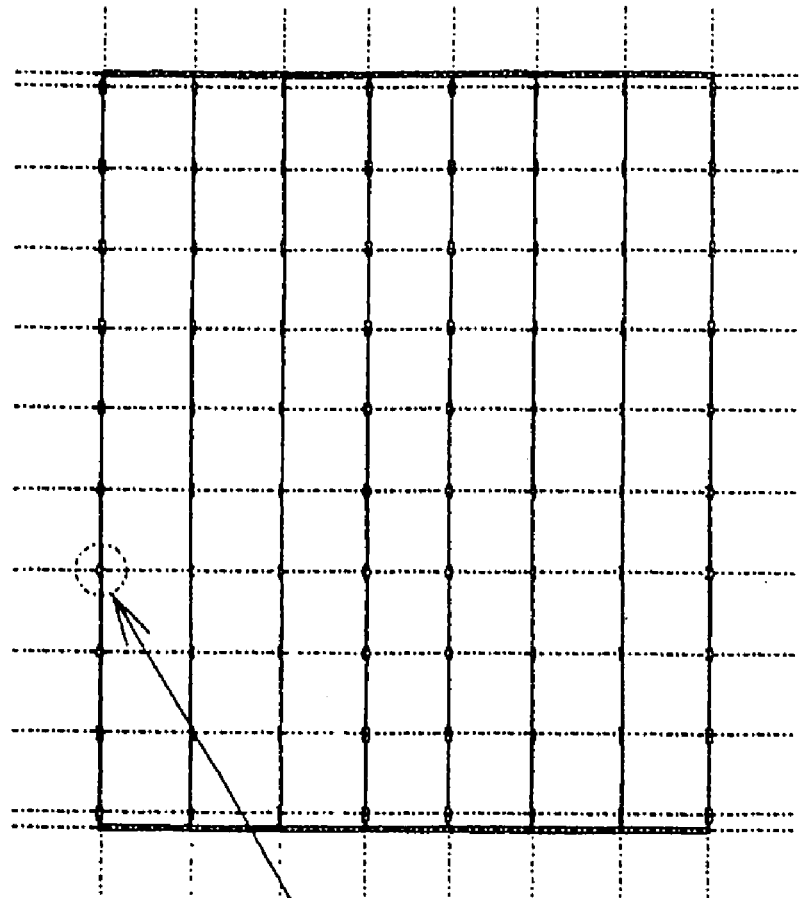
FIG. 3 is a plan view illustrating an example of a circuit pattern of a light emitting section in the light emitting module in FIG. 1.
Figure 3:
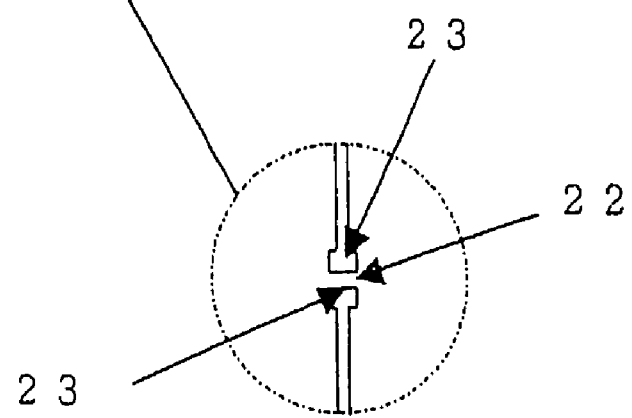
Figure 5:
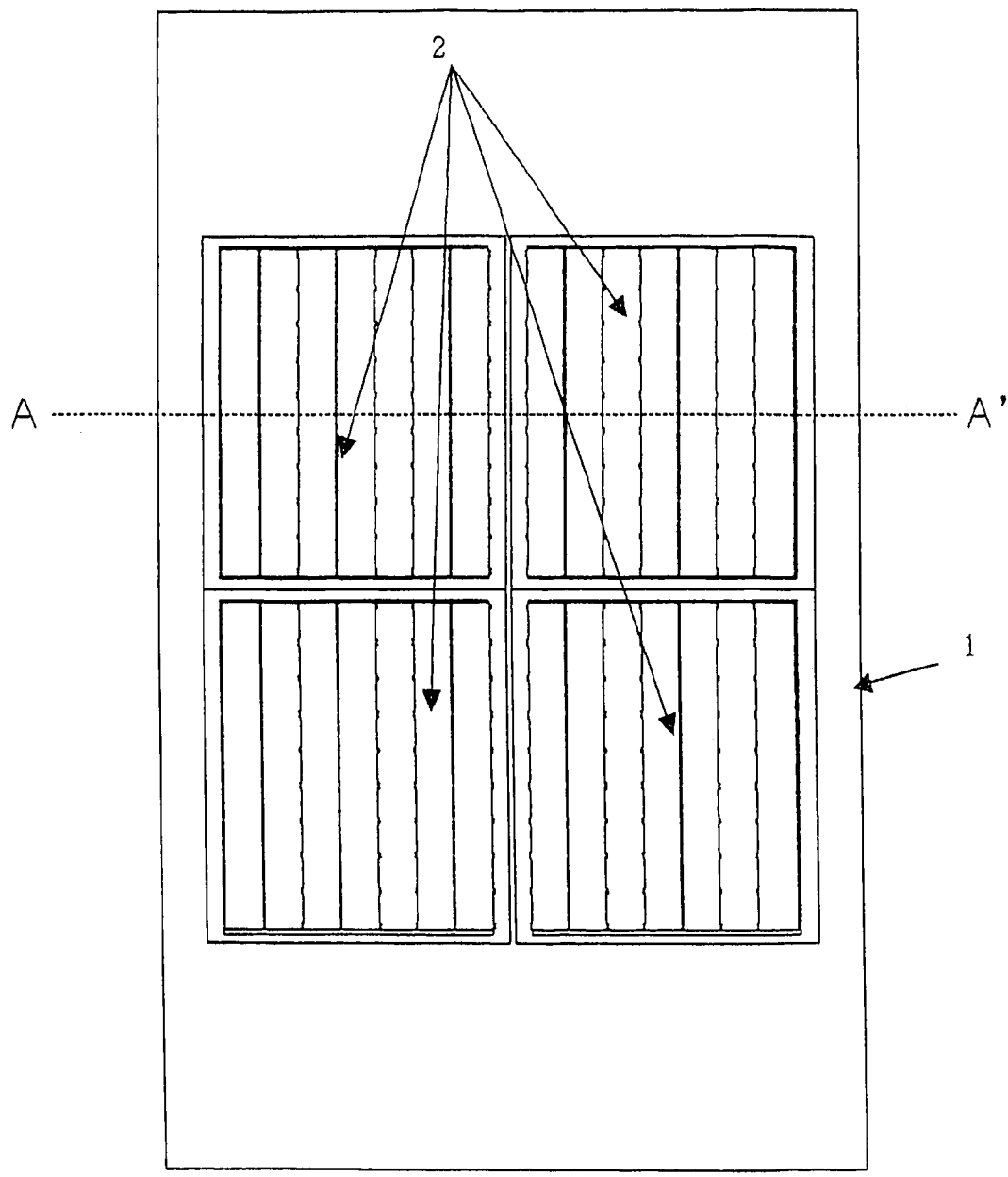
FIG. 5 is a plan view illustrating another light emitting module according to the invention.

The following will describe the production of the light emitting section 2 illustrated in FIGS. 1, 3 and 5. FIG. 5 illustrates an example of the arrangement of the light emitting section 2. For convenience' sake, illustration of electrodes of the solar battery section 1, and others is omitted. For example, a member wherein four light emitting units made of the light emitting section 2 are arranged is illustrated.

As illustrated in FIG. 1, at the time of producing the light emitting section 2, a transparent PET 17 is used as a second translucent insulating substrate on which a circuit pattern 18 is beforehand formed as a second metal layer. As the material of the circuit pattern, silver paste which is curable by heating at 150° C. for 30 minutes is used. For example, screen printing using a mask is used to form the circuit pattern 18 onto the transparent PET 17 which has a thickness of, for example, about 50 to 500 μm, and then the paste is thermally cured to form the light emitting section 2.

FIG. 3 is a plan view illustrating an example of the circuit pattern 18 of the thus-obtained light emitting section 2 according to the invention. As illustrated in FIG. 5, for example, four light emitting units, in each of which 80 chip LEDs 19 as light emitting elements are mounted onto the circuit pattern 18 in FIG. 3, are used. For example, chip LEDs each having a driving voltage of 36 volts [V], a maximum consumption current of 400 milliamperes [mA], and a consumption power of 14.4 watts [W] are constructed into each light emitting unit having a size of about 260 mm×about 300 mm.

As illustrated in FIG. 3, in these light emitting units, land patterns 23/23 for mounting the chip LEDs 19 are formed, and silver paste is printed and painted onto the land patterns 23/23 at 150° C. for 30 minutes.

Next, each of the chip LEDs 19 is mounted to make both the polarities thereof electrically conductive through the silver paste painted onto two out of the land patterns 23/23.

Next, the circuit pattern, on which the chip LEDs 19 are mounted, on the transparent PET is allowed to stand still in a heating furnace having an atmospheric temperature kept at 150° C. so as to cure the paste.

In this example, the printing step is used. However, the painting step is not limited to this step as long as the painted amount of the silver paste can be controlled. In this example, the method of curing the silver paste is used to bond the chip LEDs 19 onto the circuit pattern. However, a method of using a solder to solder the chips via a reflow step may be used.

When the solar battery section 1 and the light emitting section 2 produced in these ways are made into a module, an EVA (ethylene vinyl acetate) layer 16, which is a first adhesive layer, is sandwiched between the solar battery section 1 and the light emitting section 2. An EVA layer 20 as a second adhesive layer having a larger thickness than the height of the chip LEDs 19 arranged in the light emitting section 2 is sandwiched between the light emitting section 2 and a glass substrate 21 as a third translucent insulating substrate for protecting this light emitting section 2. The resultant is kept at 130° C. for 20 minutes to melt the EVA, and then kept at 150° C. for 45 minutes to crosslink the EVA.

In this example, the glass substrate 21 is used to protect the chip LEDs 19. However, a fluorine based resin having a high weather resistance may be used instead of this glass substrate. In the case of using, as each of the first to third translucent insulating substrates, a plastic substrate having no heat resistance, such as polycarbonate, it is necessary to use low-temperature EVA. In this case, the EVA-attached substrate is kept at 120° C. for 10 minutes to melt the EVA, and then kept at 130° C. for 45 minutes to crosslink the EVA.

The light emitting module produced as described above is a light emitting module wherein the solar battery section 1, which transmits a part of incident light while generating electric power in the daytime, and the light emitting section 2, which emits light when electric power is supplied thereto, are physically integrated with each other so that power generating areas and light emitting areas overlap; therefore, in the place where the module is installed, sure retention of the area of the light emitting section and sure retention of the area of the power generating section are compatible with each other so that the module can be installed without receiving any limitation about installation area. When the module is combined with a solar battery or some other battery, the combination can be used in, for example, an outdoor illumination or a guide sign.

Embodiment 2

Figure 4:
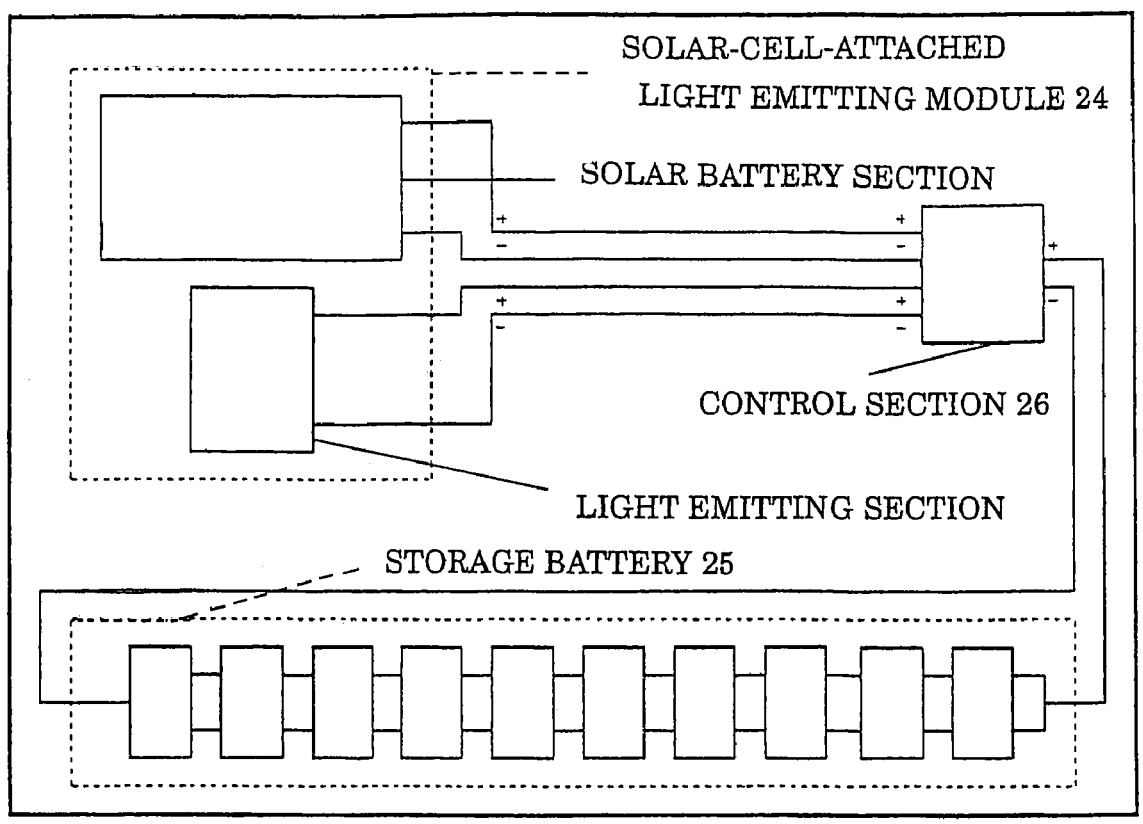
FIG. 4 is a plan view illustrating a light emitting system according to the invention schematically.

With reference to FIGS. 1 and 4, an embodiment (embodiment 2) of the light emitting system of the different aspect of the invention is described. FIG. 4 shows a black diagram of this light emitting system, and this light emitting system comprises a light emitting module 24, a storage battery 25, and a control section 26.

In the daytime, this light emitting system transmits a part of incident light, and further the storage battery 25 is charged by the electric power generated in the solar battery section 1. In the nighttime, the light emitting section 2 can be caused to emit light by the supply of electric power from the storage battery 25.

The storage battery 25 may be a lead storage battery, a nickel/metal hydride battery, a lithium/ion battery or any other secondary battery, or a capacitor. For example, in the case that 10 lithium/ion cells connected in series, each of the cells being capable of being charged up to 4.2 V, are used in the storage battery, the storage battery, wherein the 10 cells are connected in series, can be charged up to 42 V.

The control section 26 may be any control section as long as the section comprises a circuit capable of switching a charging mode and a discharging mode. The control section 26 has a function of monitoring the battery voltage of the solar battery section 1 to switch the charging mode or the discharging mode, a function of monitoring the battery level of the storage battery 25 to switch an overcharging mode or an overdischarging mode, a function of detecting a person or the like by use of infrared rays, a function of adjusting the electric power supplied to a load in the charging mode in a pulse voltage modulating output manner, or some other function.

Embodiment 3

Figure 6:
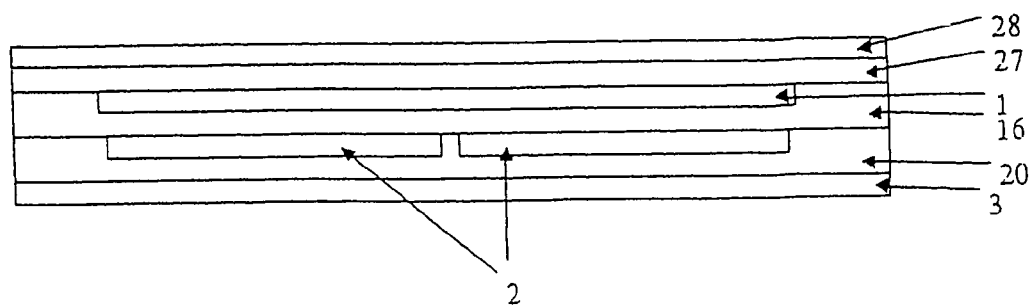
FIG. 6 is a sectional view taken along line A-A' in FIG. 5.
Figure 7:
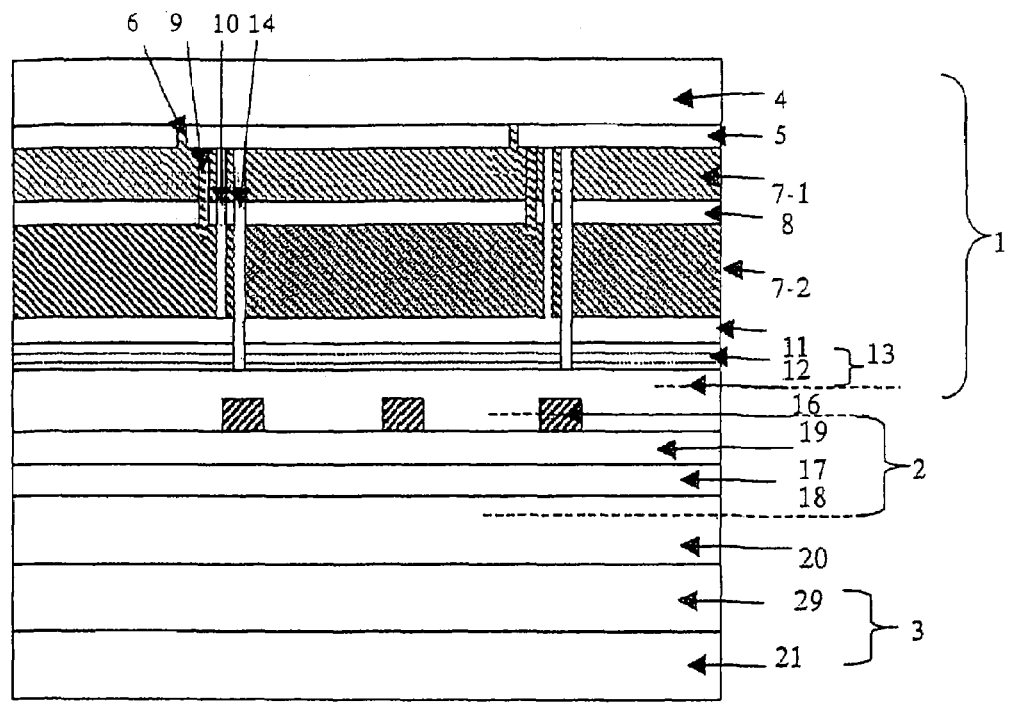
FIG. 7 is a plan view illustrating still another light emitting module according to the invention.

With reference to the FIGS. 1, 5 and 6, an embodiment (embodiment 3) of the light emitting module according to the one aspect of the invention is described. FIG. 6 is a sectional view taken along line A-A' in FIG. 5. FIG. 6 illustrates a light emitting module having the same structure as in the embodiment 1 except that besides the light emitting module of the embodiment 1 a protective section 28, as a fourth translucent insulating substrate, is formed on the side of the power generating section.

This light emitting module is characterized in that besides the structure in FIG. 1 the protective section 28 made of, for example, glass, preferably reinforced glass, is arranged on the light receiving face side of the solar battery section 1 so as to interpose a third adhesive layer 27 therebetween. In the case that the protective section 28 projects outwards from the solar battery section 1 and the light emitting section 2, the sides of the sections 1 and 2 are preferably filled with the first to third adhesive layers 16, 20 and 27, so that the side faces are each made into the form of a single plane. Details of the power generating section 1 and the light emitting section 2 are omitted.

Embodiment 4

With reference to the FIGS. 7, 2, 3 and 5, an embodiment (embodiment 4) of the light emitting module according to the one aspect of the invention is described. This light emitting module comprises a solar battery section 1, a light emitting section 2, a reflective section and a protective section 3.

The solar battery section 1 has the same structure as in the embodiment 1. The light emitting section 2 basically has the same structure as in the embodiment 1; however, the place where chip LEDs 19 are arranged, and the direction of the LEDs are different from those in the embodiment 1.

In the production of the reflective section, a third substrate, for example, a glass substrate 21 is used as the protective section 3, and a Ag film 29, which has a high reflectivity, is formed on the surface of the glass substrate 21 by RF sputtering. This way makes it possible to discharge light emitted in the light emitting section 2 toward the side of the power generating section, which is the solar battery section 1, without leaking the light to the side opposite to the power generating section. At this time, the Ag film 29, which has a high reflectivity, is used on the glass substrate 21; however, the member for reflection is not limited to this film as long as the member is a metal film. A method of causing a piece of metal foil such as Al foil or Ag foil to adhere through an adhesive may be used.

The glass substrate 21 may be a substrate having no translucency. It is allowable to use a colored glass, a plate made of a metal such as Al, stainless steel, gold, silver or copper, or a substrate made of wood or plastic.

When the solar battery section 1 and the light emitting section 2, which are each formed in the above-mentioned way, are made into a module, an EVA (ethylene vinyl acetate) layer 16 which has a larger thickness than the height of chip LEDs 19 arranged in the light emitting section 2 is sandwiched, as a first adhesive layer, between the solar battery section 1 and the light emitting section 2. Furthermore, an EVA layer 20 as a second adhesive layer is sandwiched between the light emitting section 2 and a third substrate, such as a glass substrate 21, for protecting this light emitting section 2. The resultant is kept at 130° C. for 20 minutes to melt the EVA, and then kept at 150° C. for 45 minutes to crosslink the EVA.

In this example, the glass substrate 21 is used to protect the chip LEDs 19; however, instead of this, a fluorine based resin having a high weather resistance may be used. In the case of using, a plastic substrate having no heat resistance, such as polycarbonate, as the first or second translucent insulating substrate or the third substrate, it is necessary to use low-temperature EVA. In this case, the EVA-attached substrate is kept at 120° C. for 10 minutes to melt the EVA, and then kept at 130° C. for 45 minutes to crosslink the EVA.

The light emitting module produced as described above is a light emitting module wherein the solar battery section 1, which generates electric power in the daytime, and the light emitting section 2, which emits light when electric power is supplied thereto, are physically integrated with each other so that power generating areas and light emitting areas overlap, and further the main light-emitting direction of the LEDs is along the power generating section direction; therefore, in the place where the module is installed, sure retention of the area of the light emitting section and sure retention of the area of the power generating section are compatible with each other so that the module can be installed without receiving any limitation about installation area. When the module is combined with a solar battery or some other battery, the combination can be used in, for example, an outdoor illumination or a guide sign.

Embodiment 5

Figure 8:
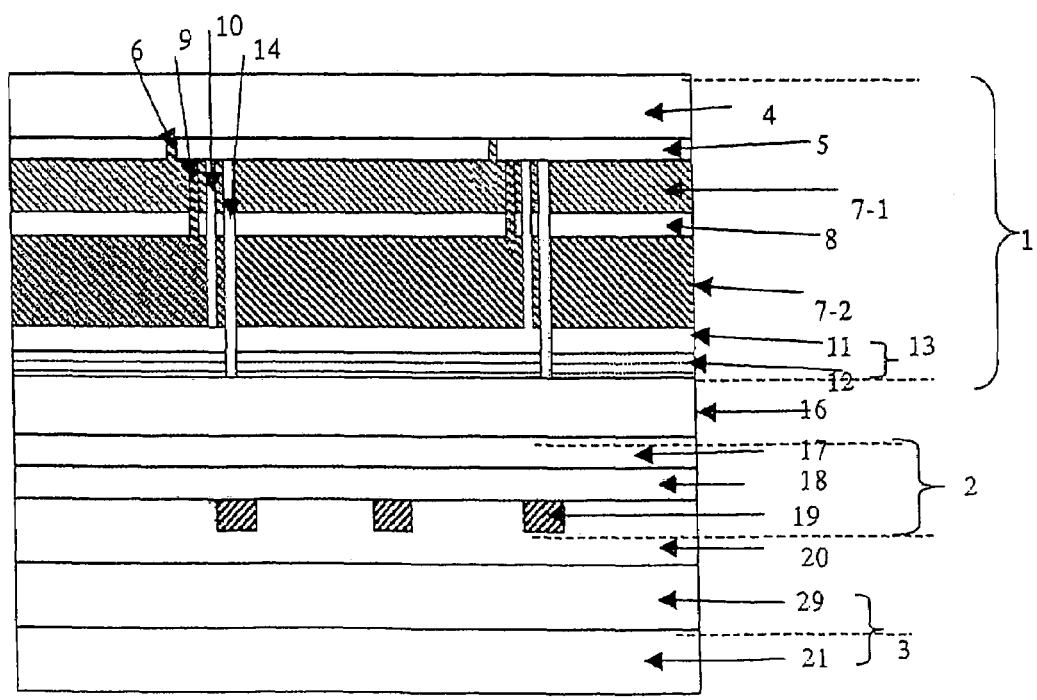
FIG. 8 is a plan view illustrating a different light emitting module according to the invention.

With reference to FIG. 8, an embodiment (embodiment 5) of the light emitting module according to the one aspect of the invention is described. FIG. 8 illustrates a light emitting module having the same structure as in the embodiment 4 except that the module has an arrangement wherein the main light emitting direction of chip LEDs 19 faces the reflective section in the light emitting module of the embodiment 4 illustrated in FIG. 7.

In the light emitting module produced as described above, the solar battery section 1, which generates electric power in the daytime, and the light emitting section 2, which emits light when electric power is supplied thereto, are physically integrated with each other, there is an arrangement wherein the main light-emitting direction of the chip LEDs 19 faces the direction opposite to the power generating section 1, and the second translucent insulating substrate 17 is interposed between the power generating section 1 and the light emitting section 2, whereby the electrode 12 of the power generating section 1 and the circuit pattern 18 of the light emitting section 2 are more satisfactorily made electrically non-conductive.

About the light emitting module produced described above, sure retention of the area of the light emitting section and sure retention of the area of the power generating section are compatible with each other in the place where the module is installed in the same manner as in the embodiment 1. Therefore, the module can be installed without receiving any limitation about installation area. Furthermore, when the module is combined with a solar battery or some other battery, the combination can be used in, for example, an outdoor illumination or a guide sign.

The above has described several embodiments; an example of the place where the light emitting module is installed is a wall face of a building or the like. Using electric power generated in the daytime, the module is used in a wall face illumination, or the module can be caused to have a display function in accordance with an arrangement where LEDs are switched on.

INDUSTRIAL APPLICABILITY

The light emitting module and the light emitting system of the invention can widely be applied to small-sized or large-sized illuminations, guide signs, and others.

The invention claimed is:

1. A light emitting module comprising at least a) a solar battery section including a first translucent insulating substrate, a transparent electroconductive layer, a photoelectric conversion layer, and a first metal layer, b) a first adhesive layer, c) a light emitting section including a second translucent insulating substrate, a second metal layer, and a light emitting element, d) a second adhesive layer, and e) a protective section of a third translucent substrate which are successively laminated in this order.

2. A light emitting module comprising at least a) a solar battery section including a first translucent insulating substrate, a transparent electroconductive layer, a photoelectric conversion layer, and a first metal layer, b) a first adhesive layer, c) a light emitting section including a second translucent insulating substrate, a second metal layer, and a light emitting element, d) a second adhesive layer, and e) a reflective section for reflecting light from the light emitting section which are successively laminated in this order.

3. The light emitting module according to claim 1, wherein a third adhesive layer and a fourth translucent insulating substrate are further laminated successively on the side of the first translucent insulating substrate opposite to the transparent electroconductive layer side thereof.

4. The light emitting module according to claim 1, wherein the light emitting section comprises plural light emitting units.

5. The light emitting module according to claim 2, wherein the reflective section includes at least a reflective layer and a protective section constituted by a third substrate.

6. A light emitting system, comprising:
the light emitting module according to claim 1;
a storage battery charged by electric power that is generated in the solar battery section of the light emitting module; and
a control section that is electrically connected to this storage battery and the solar battery section and the light emitting section of the light emitting module, and that monitors voltage generated in the solar battery section to switch between a charging mode from the solar battery section to the storage battery and a discharging mode from the storage battery to the light emitting section.

7. The light emitting system according to claim 6, wherein the second metal layer in the light emitting section of the light emitting module constitutes a circuit pattern for causing the light emitting element to emit light, and this circuit pattern is made from an electroconductive paste.

8. The light emitting system according to claim 6, wherein the light emitting element is a chip LED.

9. The light emitting system according to claim 8, wherein the chip LED is fitted to the circuit pattern through an electroconductive paste.

10. The light emitting system according to claim 6, wherein all of the adhesive layers in the light emitting module are each made of a low-temperature crosslinkable EVA film.

11. The light emitting system according to claim 6, wherein at least one part of the solar battery section of the light emitting module is made of a see-through type solar battery.

* * * * *